United States Patent
Park et al.

(10) Patent No.: US 8,542,035 B2
(45) Date of Patent: Sep. 24, 2013

(54) SQUELCH DETECTION CIRCUIT

(75) Inventors: Hong June Park, Pohang-si (KR); Seong Hwan Jeon, Daegu-si (KR)

(73) Assignee: Postech Academy-Industry Foundation, Pohang-Si, Gyeongsangbuk-Do (KR)

( * ) Notice: Subject to any disclaimer, the term of this patent is extended or adjusted under 35 U.S.C. 154(b) by 0 days.

(21) Appl. No.: 13/519,316

(22) PCT Filed: Dec. 15, 2010

(86) PCT No.: PCT/KR2010/008992
§ 371 (c)(1),
(2), (4) Date: Jun. 26, 2012

(87) PCT Pub. No.: WO2011/081330
PCT Pub. Date: Jul. 7, 2011

(65) Prior Publication Data
US 2012/0280721 A1    Nov. 8, 2012

(30) Foreign Application Priority Data
Dec. 28, 2009  (KR) .................. 10-2009-0131579

(51) Int. Cl.
*H03K 5/22* (2006.01)
(52) U.S. Cl.
USPC ............... 327/65; 327/66; 327/76; 455/218; 455/222
(58) Field of Classification Search
USPC .................. 327/65, 66, 76; 455/218, 222
See application file for complete search history.

(56) References Cited

U.S. PATENT DOCUMENTS

| 5,303,407 | A * | 4/1994 | Juergensen et al. ........... 455/222 |
| 6,859,645 | B2 * | 2/2005 | Yu ................................. 455/222 |
| 7,471,118 | B2 * | 12/2008 | Liu ................................. 327/58 |
| 7,586,336 | B2 * | 9/2009 | Blum ............................. 327/63 |
| 7,653,367 | B2 * | 1/2010 | Song et al. ................... 455/218 |
| 2002/0142743 | A1 | 10/2002 | Yu |
| 2003/0112058 | A1 | 6/2003 | Park |
| 2007/0241769 | A1 | 10/2007 | Song et al. |
| 2008/0278227 | A1 | 11/2008 | Liu |

OTHER PUBLICATIONS

International Search Report of International Appl. No. PCT/KR2010/008992, Dated Jun. 24, 2011.
PCT Written Opinion of the International Searching Authority for International Appl. No. PCT/KR2010/008992, Dated Jun. 24, 2011.

* cited by examiner

*Primary Examiner* — Kenneth B. Wells
(74) *Attorney, Agent, or Firm* — Kile Park Reed & Houtteman PLLC

(57) ABSTRACT

A squelch detection circuit for high-speed serial communication includes: an input level shifter configured to receive signals inputted through signal lines and shift the received signals to a predetermined potential level; a comparator configured to receive signals outputted from the input level shifter, and compares the received signals to determine whether data signals are noise or signal components; and a reset signal generator configured to receive the signals outputted from the input level shifter, convert the received signals into a single signal, and then generate a reset signal for an elastic buffer. The squelch detection circuit may detect a squelch state and provide a reset value for an elastic buffer in a USB 2.0 interface, and may reduce power consumption as much as possible in a suspend mode.

14 Claims, 3 Drawing Sheets

SQUELCH DETECTION CIRCUIT

TECHNICAL FIELD

The present invention relates to a squelch detection circuit, and more particularly, to a squelch detection circuit which is required in the USB 2.0 specification, detects a squelch state, and provides a reset value of an elastic buffer.

BACKGROUND ART

In the case of a bidirectional communication where data are transmitted and received at the same time through a transmission bus, it is important to determine whether or not data exist on the transmission in order to prevent a collision caused by transmission from the opposite side during transmission.

Furthermore, in order to prevent a receiver from recognizing noise as data, it is necessary to discriminate signals from noise. Therefore, when the bidirectional communication is performed on the same transmission line, a squelch detection circuit to detect whether data exist or not is additionally required in addition to data transmission and reception.

The squelch detection circuit serves to cause a signal received by a communication device or the like to be heard in a state where noise is reduced.

In general, the squelch detection circuit recognizes an input signal as noise when the magnitude of the input signal is smaller than a designated magnitude, and recognizes an input signal as a signal when the magnitude of the input signal is larger than the designated magnitude.

The squelch detection circuit described in the specification of Universal Serial Bus 2.0 (hereinafter, referred to as USB 2.0) must indicate a squelch state in which no data are transmitted, when a voltage difference between differential signals is smaller than 100 mV.

Meanwhile, in a serial interface, a transmitter and a receiver do not use the same clock signal, but the receiver uses a clock signal restored by using data transmitted from the transmitter. Therefore, the receiver uses an elastic buffer.

Accordingly, when data are transmitted in the unit of packet as in USB 2.0, the elastic buffer must be reset in a state where no data are transmitted.

Furthermore, the voltage of a differential-mode signal received by the receiver must be set in a range to operate an input terminal of a receiver amplifier. However, since a common-mode signal voltage does not have a desired value in many cases, a level shifter may be used to give an offset to a reset terminal.

However, the conventional squelch detection circuit does not provide a circuit which is required in the USB 2.0 specification and not only detects a squelch state, but also resets the elastic buffer.

DISCLOSURE

Technical Problem

Accordingly, the present invention has been made in an effort to solve the problems occurring in the related art, and an object of the present invention is to provide a squelch detection circuit which is capable of detecting a squelch state and providing a reset value for an elastic buffer, required in the USB 2.0 specification, and minimizing power consumption in a suspend mode.

Technical Solution

In order to achieve the above object, according to one aspect of the present invention, there is provided a squelch detection circuit for high-speed serial communication, including: an input level shifter configured to receive signals inputted through signal lines and shift the received signals to a predetermined potential level; a comparator configured to receive signals outputted from the input level shifter, and compares the received signals to determine whether data signals are noise or signal components; and a reset signal generator configured to receive the signals outputted from the input level shifter, convert the received signals into a single signal, and then generate a reset signal for an elastic buffer.

Advantageous Effects

In accordance with the embodiment of the present invention, the squelch detection circuit may detect a squelch state and provide a reset value for an elastic buffer in a USB 2.0 interface, and may reduce power consumption as much as possible in a suspend mode.

BRIEF DESCRIPTION OF THE DRAWINGS

The above objects, and other features and advantages of the present invention will become more apparent after a reading of the following detailed description taken in conjunction with the drawings, in which.

BEST MODE FOR THE INVENTION

Figure 1:
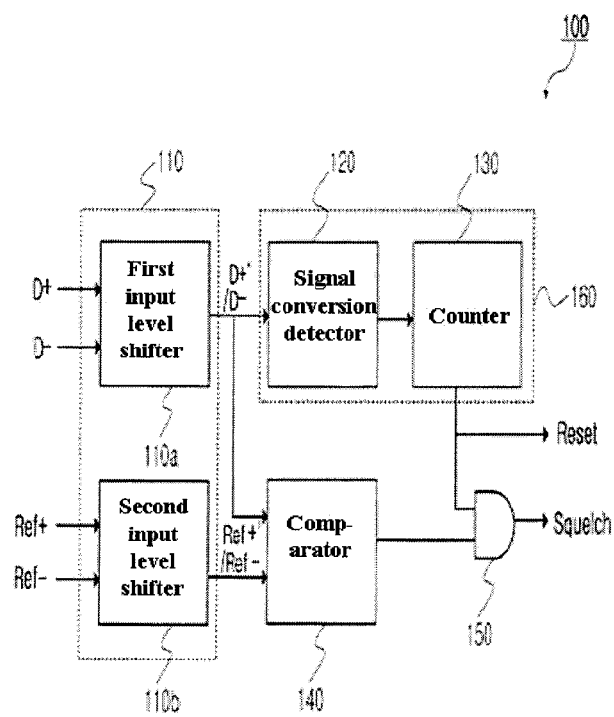
FIG. 1 illustrates a squelch detection circuit in accordance with an embodiment of the present invention.

Reference will now be made in greater detail to a preferred embodiment of the invention, an example of which is illustrated in the accompanying drawings. Wherever possible, the same reference numerals will be used throughout the drawings and the description to refer to the same or like parts.

FIG. 1 illustrates a squelch detection circuit in accordance with an embodiment of the present invention.

Referring to FIG. 1, the squelch detection circuit 100 in accordance with the embodiment of the present invention includes an input level shifter 110, a reset signal generator 160, a comparator 140, and an AND logic circuit 150. The reset signal generator 160 includes a signal conversion detector 120 and a counter 130.

The input level shifter 110 includes a first input level shifter 110*a* and a second input level shifter 110*b*. In the case of USB 2.0, the level of an input signal ranges from 0 to 400 mV. Therefore, the input signal level may be set in the range of an input terminal of the comparator 140.

The first input level shifter 110*a* is configured to receive first and second input signals D+ and D− inputted through two signal lines, shift the received signals to a predetermined potential level, and generate first and second output signals D+' and D−'.

The second input level shifter 110*b* is configured to receive first and second comparison input signals Ref+ and Ref− inputted through two signal lines, shift the received signals to a predetermined potential level, and generate first and second comparison output signals Ref+' and Ref−'.

The comparator 140 is configured to receive the first and second output signals D+' and D−' of the first input level shifter 110a through a first terminal thereof, receive the first and second comparison output signals Ref+' and Ref−' of the second input level shifter 110b through a second terminal thereof, compare the received signals, and generate a squelch signal to detect a squelch state.

Hereinafter, a process of additionally generating a reset signal for an elastic buffer of USB 2.0 using the reset signal generator 160 including the signal converter detector 120 and the counter 130 will be described.

Since USB 2.0 transmits only data through a cable without a clock signal, a difference may occur between clock signals of a transmitter and a receiver.

Meanwhile, the elastic buffer of USB 2.0 requires a buffer for temporarily storing data like FIFO (First Input First Output). Since data are not compensated by adding or subtracting a skip signal to compensate for a clock difference and an infinite number of storage places cannot be used, the elastic buffer must be reset during a period in which no data are transmitted and received.

USB 2.0 transmits data in the unit of packet. Therefore, a squelch state in which no data are transmitted and received exists between an end point of a packet and a start point of another packet. This may be used to reset the FIFO of the elastic buffer.

Specifically, the signal conversion detector 120 and the counter 130 may be used to count a period between packets. When the squelch period continues, it indicates a state before a new packet is started after a packet is ended. Therefore, a squelch signal should be generated.

The AND logic circuit 150 is configured to receive the squelch signal generated by the comparator 140 and a signal generated by the counter 130 to count a period where signal change does not occur, perform an AND operation on the received signals, and generate a new squelch signal.

Furthermore, when the period where signal change does not occur continues, that is, when signal change from 1 to 0 or from 0 to 1 does not occur, the counter 110 generates a reset signal to reset the elastic buffer.

Figure 2:
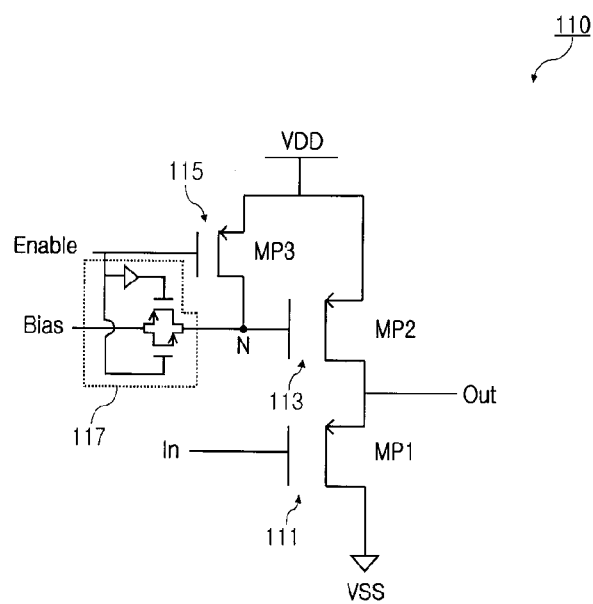
FIG. 2 is a circuit diagram of an input level shifter forming the squelch detection circuit in accordance with the embodiment of the present invention.

FIG. 2 is a circuit diagram of the input level shifter forming the squelch detection circuit in accordance with the embodiment of the present invention.

Referring to FIG. 2, the input level shifter 110 in accordance with the embodiment of the present invention includes a plurality of PMOS transistors MP1 111, MP2 113, and MP3 115 and a CMOS switch 117 between a power supply voltage VDD and a ground voltage VSS.

The input level shifter 110 is configured to receive the first and second input signals D+ and D− of the first input level shifter 110a through an input terminal In, and output the first and second output signals D+' and D−' of the first level shifter 110a to an output terminal Out thereof.

Furthermore, the input level shifter 110 is configured to receive the first and second comparison input signals Ref+ and Ref− of the second input level shifter 110b through the input terminal In, and output the first and second comparison output signals Ref+' and Ref−' of the second input level shifter 110b to the output terminal Out.

The PMOS transistor MP1 111 has a gate terminal configured to receive an input voltage and a drain terminal connected to a ground voltage VSS, and is connected in series to a drain terminal of the PMOS transistor MP2 113.

The PMOS transistor MP2 113 has a source terminal connected to the power supply voltage VDD and a gate terminal connected to a drain terminal of the PMOS transistor MP3 115 applying an enable signal through a node N and an output terminal of the CMO switch 117 applying a bias voltage Bias.

The CMOS switch 117 includes one PMOS transistor and one NMOS transistor, and has a structure in which source and drain terminals of the PMOS transistor are connected to drain and source terminals of the NMOS transistor.

Hereinafter, a circuit operation of the input level shifter 110 in accordance with the embodiment of the present invention will be described.

The input level shifter 110 in accordance with the embodiment of the present invention receives a small voltage of 0 to 400 mV through the input terminal In of the PMOS transistor PM1 111. Therefore, the input level shifter 110 includes the PMOS transistor PM1 111 to amplify the received voltage. The output voltage of the output terminal Out is adjusted to a range of 0.6 to 1.0V, which corresponds to an input level range of an amplifier 121 of the signal conversion detector 120, by the magnitude of a current flowing in the PMOS transistor PM2 113 serving as a current source.

However, when USB 2.0 is in a squelch state, all differential input signals of the input level shifter 110 have a value equal to or less than 100 mV. Therefore, a current always flows through the PMOS transistors MP1 111 and MP2 113.

Such a state causes no problems in a normal mode, but does not satisfy the condition of a suspend mode in which current consumption needs to be minimized.

The problem in the suspend mode may be solved by preventing a current of the bias terminal from flowing into the PMOS transistor MP2 113 using the PMOS transistor MP3 115 and the CMOS switch 117 in accordance with the embodiment of the present invention.

Hereinafter, an operation of controlling the current of the bias terminal Bias using the PMOS transistor MP3 115 and the CMOS switch 117 will be described in detail.

In the normal mode, the enable signal Enable is set to '1' to turn on the CMOS switch 117 and to turn off the PMOS transistor MP3 115. Then, the bias voltage Bias is connected to the gate terminal of the PMOS transistor MP2 113. Thus, the input level shifter 110 normally operates.

In the suspend mode, however, the enable signal Enable is set to '0' to turn off the CMOS switch 117 and to turn on the PMOS transistor MP3 115. Then, the gate terminal of the PMOS transistor MP2 113 serving as a current source is connected to the power supply voltage VDD, and turned off to reduce unnecessary power consumption caused by the bias voltage Bias.

Figure 3:
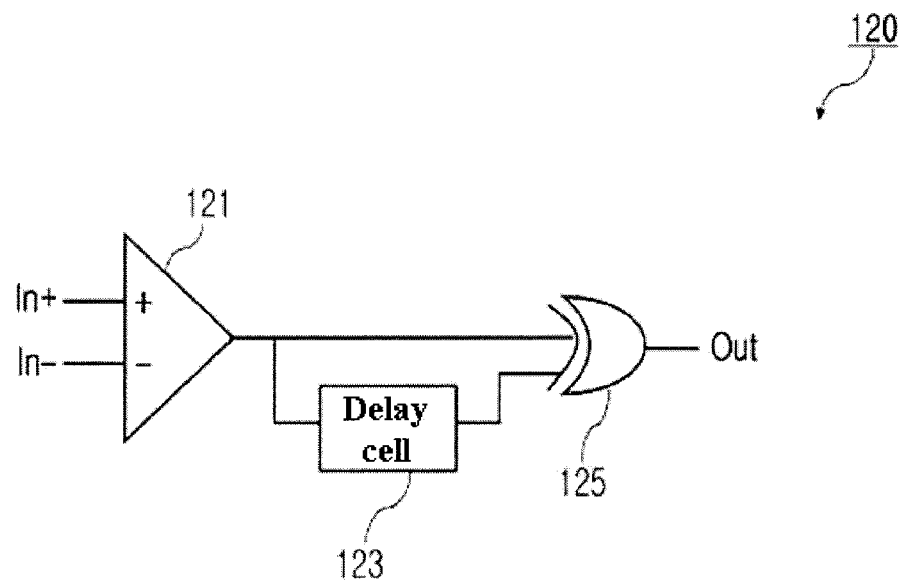
FIG. 3 is a circuit diagram of a signal conversion detector forming the squelch detection circuit in accordance with the embodiment of the present invention.

FIG. 3 is a circuit diagram of the signal conversion detector forming the squelch detection circuit in accordance with the embodiment of the present invention.

Referring to FIG. 3, the signal conversion detector 120 in accordance with the embodiment of the present invention includes an amplifier 121, a delay cell 123, and an XOR logic circuit 125.

The amplifier 121 has a hysteresis characteristic, and is configured to differentially receive the first and second output signals D+' and D−' outputted from the first input level shifter 110a through first and second input terminals In+ and In−, respectively, and convert the received signals into a single signal by comparing and amplifying the received signals.

The delay cell 123 is configured to receive the single signal and generate a delayed signal having a delay value with respect to the time.

The XOR logic circuit 125 is configured to receive the delayed signal outputted from the delay cell 123 and the single signal outputted from the amplifier 121, perform an XOR operation on the received signals, and output '1' to the output terminal Out during the delay time of the delay cell 123 when the delayed signal and the single signal have different truth values.

The signal outputted from the output terminal Out of the XOR logic circuit 125 is used as a reset signal of the counter.

Figure 4:
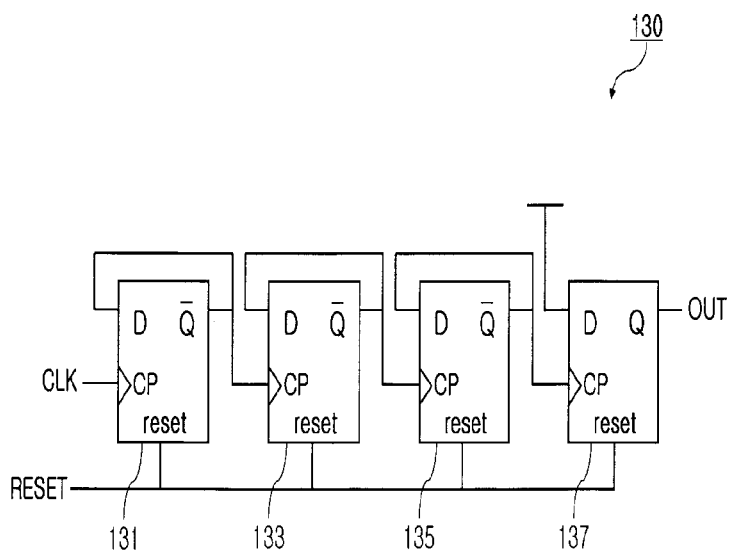
FIG. 4 is a circuit diagram of a counter forming the squelch detection circuit in accordance with the embodiment of the present invention.

FIG. 4 is a circuit diagram of the counter forming the squelch detection circuit in accordance with the embodiment of the present invention.

Referring to FIG. 4, the counter 130 in accordance with the embodiment of the present invention is a D flip-flop (D-FF) which uses a first clock signal as a clock signal of internal circuits and uses an output signal of a current stage as a clock signal of a next stage, and includes a plurality of first to fourth counters 131, 133, 135, and 137.

The first counter 131 includes a clock terminal CP configured to receive a first clock pulse CLK, an input terminal D configured to receive a single input signal, an output terminal Q configured to output an output signal, and a reset terminal configured to receive the reset signal to reset an output value of the flip-flop.

The second counter 133 has the same configuration as the first counter 131, but is configured to connect an inverted value of an output of the first counter 131 to an input of the second counter 133.

The third and fourth counters 135 and 137 are also configured to connect inverted values of outputs of the second and third counters 133 and 135 to inputs of the third and fourth counters 135 and 137, respectively.

In this embodiment of the present invention, four counters were taken as an example for description. However, the present invention is not limited thereto, and five or more counters may be used.

Hereinafter, the operation of the counter 130 in accordance with the embodiment of the present invention will be described.

Referring to FIGS. 4 and 3, when an output signal of the signal conversion detector 120 is not changed (RESET=0), the counter 130 counts a clock signal, and the fourth counter 137 at the final stage outputs an output signal of '1' after a predetermined time.

Referring to FIG. 1, since data conversion does not occur in a squelch state or between data packets in USB 2.0, the counter continuously counts without reset, and thus sets a logic value of an output signal to '1'. Therefore, the output signal may be used as a reset signal for the elastic buffer.

In the squelch state, the logic value of the reset signal for the elastic buffer, which is an output of the counter, becomes '1', and the logic value of the squelch signal generated by the comparator 140 also becomes '1'. The AND logic circuit 150 performs an AND operation on the signals, and generates a new squelch signal.

When the output signal of the signal conversion detector 120 is changed by change in input value of the signal conversion detector 120 (RESET=1), the counter 130 is reset so as not to continuously count, regardless of a clock signal. At this time, when the counter 130 is reset, the fourth counter 137 positioned at the final stage outputs an output signal of '0'.

Until the third counter 135 counts to change the clock input terminal of the four counter 137 from '0' to '1', the fourth counter 137 continuously outputs an output signal of '0'.

Figure 5:
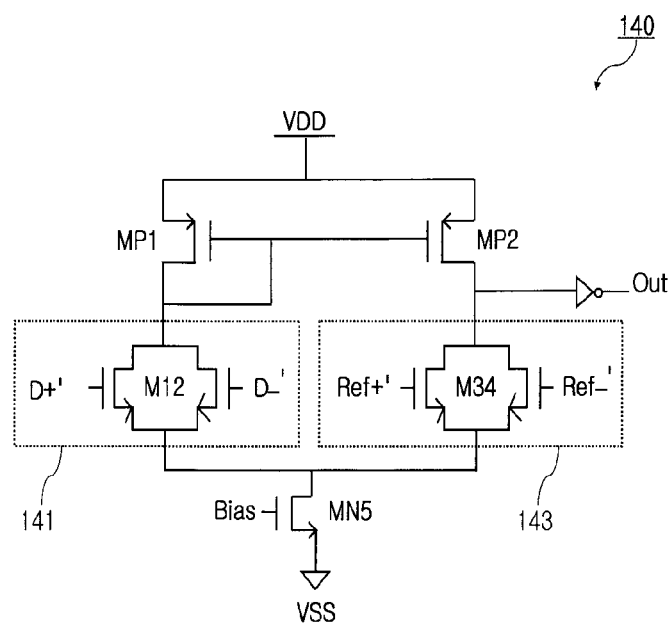
FIG. 5 is a circuit diagram of a comparator forming the squelch detection circuit in accordance with the embodiment of the present invention.

FIG. 5 is a circuit diagram of the comparator forming the squelch detection circuit in accordance with the embodiment of the present invention.

Referring to FIG. 5, the comparator 140 forming the squelch detection circuit in accordance with the embodiment of the present invention includes a plurality of PMOS transistor MP1 and MP2, a first input unit 141, a second input unit 143, and an NMOS transistor MN5 between the power supply voltage VDD and the ground voltage VSS.

The PMOS transistor MP1 has a source terminal connected to the power supply voltage VDD and a drain terminal connected to a drain terminal of the first input unit 141.

The PMOS transistor MP2 has a source terminal connected to the power supply voltage VDD and a drain terminal connected to a drain terminal of the second input unit 143.

The gate terminals of the PMOS transistors MP1 and MP2 are connected to each other.

The first input unit 141 includes two NMOS transistors MN1 and MN2, and has a structure in which source and drain terminals of the NMOS transistor MN1 are connected to source and drain terminals of the NMOS transistor MN2, respectively. The first and second output signals D+' and D-' of the first input level shifter 110a are inputted to the gate terminals of the NMOS transistors MN1 and MN2, respectively.

The second input unit 143 includes two NMOS transistors MN3 and MN4, and has a structure in which source and drain terminals of the NMOS transistor MN3 are connected to source and drain terminals of the NMOS transistor MN4, respectively. The first and second comparison output signals Ref+' and Ref-' of the second input level shifter 110b are inputted to the gate terminals of the NMOS transistor MN3 and MN4, respectively.

The NMOS transistor MN5 has a source terminal connected to the ground voltage VSS, a drain terminal connected to the source terminals of the first and second input units 141 and 142, and a gate terminal configured to receive the bias voltage Bias.

The NMOS transistor MN5 receives a voltage generated by an external bias circuit through the gate terminal thereof so as to pass a constant current. Therefore, the sum of currents of the first and second input units 141 and 143 becomes constant, and the sum of the first and second output signals D+' and D-' is compared to the sum of the first and second comparison output signals Ref+' and Ref-'.

When normal signals are inputted, a difference between the first and second output signals D+' and D-' is larger than a difference between the first and second comparison output signals Ref+' and Ref-'. In this case, since a current flowing through the first input unit 141 is larger than a current flowing through the second input unit 143, the drain voltage value of the PMOS transistor MP1 becomes lower than the drain voltage value of the PMOS transistor MP2. Then, the output value Out becomes relatively large, and the final output value is inverted to '0'.

On the other hand, when noise is inputted, a difference between the first and second output signals D+' and D-' is smaller than a difference between the first and second comparison output signals Ref+' and Ref-'. In this case, since a current flowing through the first input unit 141 is smaller than a current flowing through the second input unit 143, the drain voltage value of the PMOS transistor MP1 becomes higher than the drain voltage value of the PMOS transistor MP2. Then, the output value Out becomes relatively small, and the final output value is inverted to '1'.

Hereinafter, the operation of the comparator 140 forming the squelch detection circuit in accordance with the embodiment of the present invention will be described.

USB 2.0 may generate a squelch signal only when differential signals of the first input unit 141 are equal to or less than 100 mV. Since a difference between the reference voltages of the second input unit 143 is 100 mV, the reference voltages are decided to satisfy Ref+'=Ref−'+100 mV.

(1) When Input Signal is Changed (not Squelch State)

When the logic value of an input signal is '0' (D+'<D−'), D+'=Ref−, D−'>Ref−'+150 mV, and Ref−'=Ref+'−100 mV. Therefore, since D+'+D−'>Ref−'+Ref+'+50 mV is established, the amount of current flowing through the NMOS transistor MN12 of the first input unit 141 becomes larger than the amount of current flowing through the NMOS transistor MN34 of the second input unit 143.

Meanwhile, when the logic value of the input signal is '1' (D+'>D−'), D−'=Ref−, D+'<Ref−'+150 mV, and Ref−'=Ref+'−100 mV. Therefore, since D−'+D+'>Ref−'+Ref+'+50 mV is established, the amount of current flowing through the NMOS transistor MN12 of the first input unit 141 becomes larger than the amount of current flowing through the NMOS transistor MN34 of the second input unit 143, as in the case in which the logic value of the input signal is '0'.

That is, when the logic value of the input signal is '0' and '1', D−'+D+'>Ref−'+Ref+' is established.

(2) When Input Signal is not Changed (Squelch State)

In this case, since D+'+D−'<2*Ref−'+100 mV (=Ref−'+Ref+') is established, D−'+D+'>Ref−'+Ref+' is satisfied. Unlike when the input signal is changed, the amount of current flowing through the NMOS transistor MN34 of the second input unit 143 becomes larger than the amount of current flowing through the NMOS transistor MN12 of the first input unit 141, and a squelch state is detected through the comparator.

According to the processes (1) and (2), the comparator 140 forming the squelch detection circuit in accordance with the embodiment of the present invention may detect a squelch state by comparing the sum of currents of D+'/D−' to the sum of currents of Ref+'/Ref−'. That is, when the comparator 140 determines that D−'+D+'>Ref−'+Ref+' is established, the comparator 140 cannot detect a squelch state. However, when the comparator 140 determines that D−'+D+'<Ref−'+Ref+' is established, the comparator 140 may generate a squelch signal to detect a squelch state.

Although a preferred embodiment of the present invention has been described for illustrative purposes, those skilled in the art will appreciate that various modifications, additions and substitutions are possible, without departing from the scope and the spirit of the invention as disclosed in the accompanying claims.

The invention claimed is:

1. A squelch detection circuit for high-speed serial communication, comprising:
an input level shifter configured to receive signals inputted through signal lines and shift the received signals to a predetermined potential level;
a comparator configured to receive signals outputted from the input level shifter, and compares the received signals to determine whether data signals are noise or signal components; and
a reset signal generator configured to receive the signals outputted from the input level shifter, convert the received signals into a single signal, and then generate a reset signal for an elastic buffer.

2. The squelch detection circuit of claim 1, wherein the input level shifter comprises:
a first input level shifter configured to receive first and second input signals, shift the received signals to a predetermined potential level, and generate first and second output signals; and
a second input level shifter configured to receive first and second comparison input signals, shift the received signals to a predetermined potential level, and generate first and second comparison output signals.

3. The squelch detection circuit of claim 2, wherein the input level shifter comprises first to third PMOS transistors and a CMOS switch between a power supply voltage and a ground voltage,
the second PMOS transistor serves as a current source and has a source terminal connected to the power supply voltage and a gate terminal connected to a drain terminal of the third PMOS transistor applying an enable signal and an output terminal of the CMOS switch applying a bias voltage.

4. The squelch detection circuit of claim 3, wherein the CMOS switch comprises one PMOS transistor and one NMOS transistor, and has a structure in which source and drain terminals of the PMOS transistor are connected to drain and source terminals of the NMOS transistor, respectively.

5. The squelch detection circuit of claim 3, wherein, in a suspend mode, the enable signal is set to '0' to turn off the CMOS switch and to turn on the third PMOS transistor.

6. The squelch detection circuit of claim 1, wherein the comparator comprises:
a first input unit configured to receive the first and second output signals of the first input level shifter forming the input level shifter; and
a second input unit configured to receive the first and second comparison output signals of the second input level shifter forming the input level shifter, and
the sum of currents of the first and second output signals and the sum of currents of the first and second comparison output signals are compared to detect a squelch state.

7. The squelch detection circuit of claim 6, wherein, when the sum of currents of the first and second output signals is smaller than the sum of currents of the first and second comparison output signals, the comparator generates a squelch signal to detect a squelch state.

8. The squelch detection circuit of claim 1, wherein the reset signal generator comprises:
a signal conversion detector configured to receive differential signals outputted from the input level shifter and convert the received signals into said single signal; and
a counter configured to count a signal outputted from the signal conversion detector and generate a reset value for the elastic buffer.

9. The squelch detection circuit of claim 8, wherein the signal conversion detector comprises:
an amplifier configured to differentially receive the first and second output signals outputted from the first input level shifter forming the input level shifter through first and second input terminals thereof, respectively, and convert the received signals into a single signal;
a delay cell configured to receive the single signal and generate a delayed signal having a delay value with respect to the time; and
an XOR logic circuit configured to receive the single signal and the delayed signal and perform an XOR operation on the received signals.

10. The squelch detection circuit of claim 8, wherein the counter comprises a D flip-flop configured to use a first clock signal as a clock signal of internal circuits and use an output signal of a current stage as a clock signal of the next stage.

11. The squelch detection circuit of claim 10, wherein, when an output signal of the signal conversion detector is not changed, the counter is reset to '0', counts a clock signal, and generates a squelch signal and a reset signal to reset the elastic buffer after a predetermined time.

12. The squelch detection circuit of claim 11, wherein the squelch signal is generated by an AND logic circuit configured to receive a logic value '1' of the squelch signal generated by the comparator and a logic value '1' of the reset signal for the elastic buffer, which is outputted from the counter, and perform an AND operation on the received values.

13. The squelch detection circuit of claim 10, wherein, when an output signal of the signal conversion detector is changed, the counter is reset to '1' regardless of a clock signal so as not to continuously count.

14. The squelch detection circuit of claim 1, wherein the high-speed serial communication comprises USB 2.0.

* * * * *